United States Patent [19]

Dreslinski

[11] 4,021,644

[45] May 3, 1977

[54] CIRCUIT FOR MONITORING THE SEQUENCE OF EVENTS AT A CASHIER CHECKOUT CENTER

[75] Inventor: Daniel M. Dreslinski, Livonia, Mich.

[73] Assignee: Automatic Parking Devices, Inc., Farmington, Mich.

[22] Filed: Oct. 16, 1975

[21] Appl. No.: 622,878

[52] U.S. Cl. .................. 235/92 TC; 235/92 FP; 235/92 R

[51] Int. Cl.[2] .................. H03K 21/00

[58] Field of Search ....... 235/92 CP, 92 DP, 92 FP, 235/92 TC, 92 EV, 92 MS, 92 R, 152, 164, 168, 176; 340/172.5

[56] References Cited
UNITED STATES PATENTS

| | | | |
|---|---|---|---|
| 3,001,704 | 9/1961 | Lafaurle | 235/92 FP |
| 3,079,077 | 2/1963 | Bolton | 235/92 EV |
| 3,081,941 | 3/1963 | Hilliker | 235/92 EV |
| 3,110,010 | 11/1963 | Smith | 235/92 EV |
| 3,212,615 | 10/1965 | Hellar, Jr. | 235/92 TC |
| 3,588,472 | 6/1971 | Glaster et al. | 235/92 EV |
| 3,748,444 | 7/1973 | Gilboy et al. | 235/92 FP |
| 3,808,410 | 4/1974 | Schlesinger | 235/152 |

*Primary Examiner*—Gareth D. Shaw
*Assistant Examiner*—John P. Vandenburg
*Attorney, Agent, or Firm*—Barnes, Kisselle, Raisch & Choate

[57] ABSTRACT

A circuit for monitoring the sequence of events at a cashier checkout center and for providing a cashier violation signal after a preselected number of customers have passed through the checkout center without corresponding customer transactions having been entered by the cashier.

11 Claims, 1 Drawing Figure

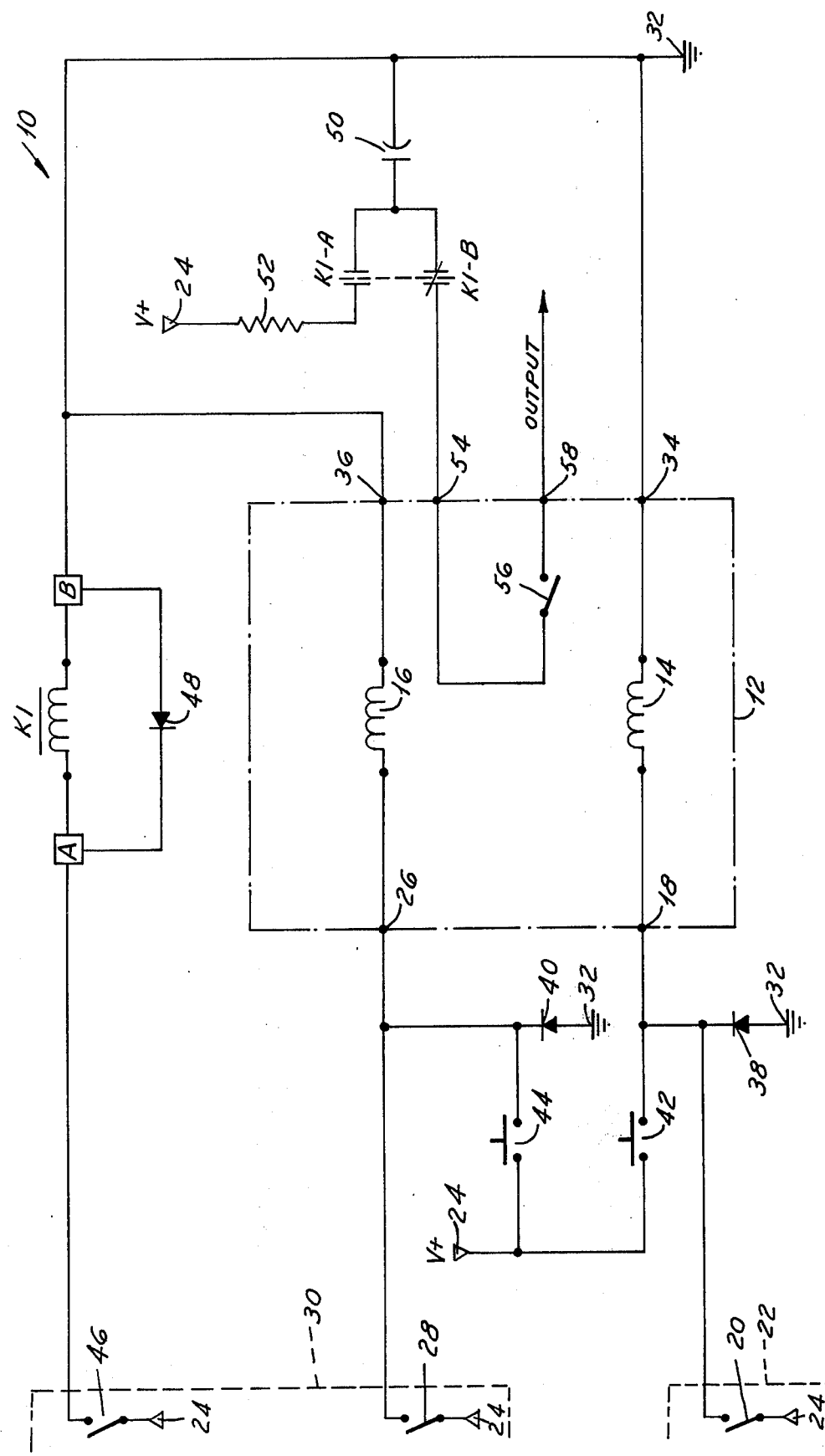

CIRCUIT FOR MONITORING THE SEQUENCE OF EVENTS AT A CASHIER CHECKOUT CENTER

The present invention relates to monitoring circuits and, more specifically, to circuits for monitoring the sequence of events at a cashier checkout center.

At a commercial parking facility situations often arise wherein a customer approaches a cashier checkout center or booth, pays his fee and exits the lot, all without the cashier having entered the customer transaction on his cash register. These circumstances may arise, for example, where the facility charges a fixed parking fee, or where a customer knows his fee, fixed or hourly, in advance and has the exact change. Often, as during rush hours when traffic backs up at the checkout center, the cashier may be tempted to set aside the transaction, i.e., parking ticket and money, for later entry on the register when business slackens. It has previously been recognized that such an accumulation of a transaction backlog is undesirable. Stated differently, it has heretofore been recognized that the checkout center cashier should be encouraged to follow a preselected sequence during the checkout procedure which includes the step of entering into the register the transaction associated with a particular customer before accepting the parking ticket and money from the next customer.

In circuits heretofore proposed for monitoring the sequence of events at a cashier checkout center, an array of relays has been provided, with the relays being sequentially energized as customers approach the checkout center and de-energized when the associated transactions are registered, the number of relays energized at any given time being thereby indicative of the cashier's transaction backlog. However, a number of problems associated with circuits of this type have rendered them generally unsatisfactory. For example, sequencing problems often occur when a car approaches the checkout center at the same time as the cashier is attempting to enter the previous transaction, whereby the circuit becomes unsynchronized and is rendered useless until reset.

It is an object of the present invention to provide a circuit for monitoring the sequence of events at a cashier checkout center which is economical in assembly and reliable in operation, which may be selectively preprogrammed and/or reprogrammed to monitor for a transaction backlog of any selected number, and which will not become desynchronized in operation.

The novel features which are considered to be characteristic of the present invention are set forth in particular in the appended claims. The invention itself, however, together with additional objects, features and advantages thereof, will be best understood from the following description when read in conjunction with the accompanying drawing which is a schematic diagram of a presently preferred embodiment of the cashier monitor circuit provided by the present invention.

Referring to the drawing, the cashier monitor circuit 10 herein disclosed includes an electromechanical, bidirectional counter 12 having an add- or increment-coil 14 and a subtract- or decrement-coil 16. Increment-coil 14 is connected via counter terminal 18 through a normally open switch 20 at a cash register 22 to a positive D.C. voltage source 24. Switch 20 provides a momentary closure, on the order of one hundred fifty milliseconds in duration, when a customer transaction is entered into register 22. Similarly, decrement-coil 16 is connected via counter terminal 26 through a normally open switch 28 to voltage source 24 in a customer detector 30 which, in the case of parking lot cashier monitoring circuits, comprises a conventional magnetic detector responsive to the proximity of an automobile to close switch 28. Detector 30 preferably comprises a model LD-10-B magnetic proximity detector marketed by the assignee hereof. Switch 28 provides a momentary closure, again on the order of one hundred fifty milliseconds in duration, when an automobile first approaches the checkout center. Coils 14, 16 are also connected to signal ground 32 via counter terminals 34, 36 respectively. A pair of diodes 38, 40 are respectively connected in the reverse voltage direction across coils 14, 16 to suppress inductive ringing therein. A pair of normally open push botton switches 42, 44 for checking and preprogramming counter 12 are respectively connected between voltage source 24 and counter terminals 18, 26.

A relay coil K1 is connected from ground 32 to voltage source 24 through a second normally open switch 46 in detector 30. Switch 46 provides a steady closure for the duration of time that a customer, in this case in an automobile, is in the proximity of the checkout center. A diode 48 is connected in the reverse voltage direction across coil K1. A pair of normally open relay contacts K1-A operatively associated with coil K1 are respectively connected through a capacitor 50 to ground 32 and through a resistor 52 to voltage source 24. Similarly, a pair of normally closed relay contacts K1-B operatively associated with coil K1 are respectively connected to the voltage side of capacitor 50 and to a counter terminal 54. It will be recognized, of course, that contact pairs K1-A and K1-B may conveniently constitute a single relay contact set having a common contact connected to capacitor 50, a normally open contact connected to resistor 52 and a normally closed contact connected to terminal 54.

A normally open switch 56 is provided within counter 12 between terminal 54 and another counter terminal 58. In a presently preferred embodiment of the invention, switch 56 provides a closure between counter terminals 54, 58 when the count in counter 12 drops below zero, i.e., is decremented stepwise through zero. In one working model of the present invention wherein counter 12 comprises a four level, electromechanical decade counter manufactured by Sedco of Geneva, Switzerland, Model No. RR111E, switch 56 comprises a closure bar on the thousands wheel of the counter, which bar makes electrical contact with a pair of fixed terminals when the associated wheel is in the "nine" position. Thus, switch 56 closes when counter 12 is decremented from a count of zero to a count of 9999. Of course, switch 56 will reopen at a counter of 8999; however, as will become evident from the discussion to follow, this would represent a backlog of over one thousand transaction entires, a circumstance which is not foreseen in normal operation. Counter terminal 58 comprises the output from cashier monitor circuit 10 and may be connected to a suitable alarm or to a device for recording a cashier backlog violation.

In the operation of monitor circuit 10, counter 12 is first preprogrammed by entering a count equal to the number of transactions in an allowable backlog. For example, if a backlog of two transactions is to be allowed before a cashier violation is noted, a count of two is entered into counter 12 by depressing switch 42 twice. Should it later be decided that the number of transactions in an allowable backlog must be reduced to one, the counter may be reprogrammed by merely pushing switch 44 once, thereby decrementing the counter. It will be assumed in the following discussion that circuit 10 has been preprogrammed for an allowable backlog of one transaction. Operation of circuit 10 for an allowable backlog of two or more transactions will become evident. It will be understood, of course, that the number of transactions in an allowable backlog is usually set by the management of the associated premises and not by the cashier. Accordingly, switches 42, 44 may be located within a locked enclosure or at a management office remote from the checkout center. With cashier monitor circuit 10 programmed at the allowable transaction backlog, the associated checkout center or booth may be opened for business.

As the first customer approaches the checkout center, proximity switch 26 is momentarily closed, thereby decrementing counter 12 to a count of zero. At the same time, switch 46 closes, energizing relay coil K1 and charging capacitor 50 via contact K1-A and resistor 52. If the customer presents the exact amount of his parking fee, he may leave the checkout center before the cashier has had an opportunity to register the transaction. Accordingly, this transaction does not yet constitute a backlog. When the first customer leaves, coil K1 is de-energized and the voltage side of capacitor 50 is connected to counter terminal 54 via contacts K1-B.

A second customer may now approach the checkout center, providing a pulse at counter terminal 26 such that the counter is decremented to 9999 and switch 56 is closed. However, the second customer also reenergizes relay K1 via switch 46 so that capacitor 50 is no longer connected to terminal 54. If the cashier now enters either the first or second customer's transaction, the counter will be incremented to zero so that switch 56 re-opens and no violation signal will be noted when the second customer leaves. If, however, the second customer departs before the cashier has registered either the first or the second transaction, switch 56 remains closed such that, when relay coil K1 is deenergized, the voltage on capacitor 50 is presented at output terminal 58, thereby indicating that the allowable backlog of one has been exceeded, i.e., providing a violation signal. Additional customers passing through the checkout center will each initiate a violation signal until the backlog is reduced to an allowable level of one (or zero).

It will now be apparent that the cashier monitor circuit provided by the present invention and disclosed hereinabove fully satisfies all of the objects, aims and advantages previously set forth. Furthermore, it will be evident that, although the invention has been disclosed in connection with a specific embodiment thereof, many alternatives, modifications and variations will suggest themselves to persons skilled in the art in view of the foregoing description. For example, although the invention as disclosed comprises a specific type of electromechanical counter 12, suitable digital counting means having an appropriate "borrow" output may be readily substituted therefor where the application permits. Similarly, although the invention has been disclosed in connection with a parking lot cashier booth where it has been found to be particularly advantageous, the invention may be readily adapted to different types of cashier checkout centers where similar circumstances apply. Accordingly, the invention is intended to embrace these and all other such alternatives, modifications and variations as fall within the spirit and broad scope of the appended claims.

The invention claimed is:

1. In a circuit for monitoring the sequence of events at a cashier checkout center and which includes a register for entering customer transactions and means detecting the presence of a customer at said center, the improvement comprising a bidirectional counter operatively connected to said register and said detecting means to count in one direction as customers arrive at said center and in the other direction as transactions are entered on said register such that said counter provides a count of the difference between the number of customers which have been present at said center and the number of transactions entered on said register, means responsive to said counter for indicating that the count in said counter has reached a preselected count in said one direction corresponding to a preselected number of customers having been present at said center without corresponding register transactions having been entered, and means responsive to said indicating means for providing a cashier violation signal.

2. The circuit set forth in claim 1 further comprising means connected to said presence detecting means and to said indicating means to enable provision of said violation signal only when a customer has left said center.

3. The circuit set forth in claim 1 wherein said counter is successively decremented in said one direction as customers arrive at said center and is successively incremented in said other direction as transactions are entered on said register, and wherein said violation signal is provided after said counter has been decremented through zero.

4. The circuit set forth in claim 3 further comprising means connected to said counter to preset said counter at a selected level above zero equal to said preselected count prior to operation of said center, said level corresponding to an allowable number of backlogged transactions.

5. The circuit set forth in claim 4 wherein said indicating means comprises a pair of terminals, means providing an electrical closure between said terminals when said counter has been decremented through zero, said violation signal providing means comprising means connected to said presence detecting means to provide a first signal at a first terminal of said pair only when a customer has left said center, whereby a violation signal is provided at the second terminal of said pair in response to said electrical closure between said terminals.

6. The circuit set forth in claim 5 wherein said center includes a source of electrical power, and wherein said first signal providing means comprises a relay which includes a coil connected to said presence detecting means and a relay switch having normally open and normally closed contacts, said relay being energized when a customer is present at said station, and a capacitor connected in series with said normally open contacts across said power source whereby said capacitor is charged when a customer is present at said center, said normally closed contacts being connected between said capacitor and said first terminal whereby said capacitor provides said first signal at said first terminal.

7. In a circuit for monitoring the sequence of events at a cashier checkout center and which includes means responsive to the presence of a customer at said center to provide a customer signal and a cash register responsive to entrance of a customer transaction by the cashier to provide a transaction signal, the improvement comprising a bidirectional counter having a first input connected to said presence responsive means to step said counter in one direction in response to said customer signal and a second input connected to said cash register to step said counter in the other direction in response to said transaction signal, means for indicating when the count in said counter has reached a preselected count in said one direction, and means responsive to said indicating means for providing a cashier violation signal.

8. In a circuit for monitoring the sequence of events at a cashier checkout center and which includes a cash register responsive to entrance of a customer transaction to provide a transaction signal and means responsive to the presence of a customer at said center to provide a first signal as the customer approaches said center and a second signal as the customer leaves said center, the improvement comprising a bidirectional counter having a first input responsive to said transaction signal to increment said counter and a second input responsive to said first signal to decrement said counter, means for indicating when said counter has been decremented through zero, and means responsive to both said second signal and said indicating means to provide a violation signal only when both the customer has left said center and said counter has been decremented through zero.

9. The circuit set forth in claim 8 further comprising means for preprogramming said counter at a count above zero which corresponds to an allowable backlog of customer transactions.

10. The circuit set forth in claim 9 wherein said preprogramming means comprises a manually operable switch electrically connected to said first input to increment said counter by a count of one upon each closure of said switch.

11. The circuit set forth in claim 10 wherein said preprogramming means further comprises a second manually operable switch electrically connected to said second input to decrement said counter by one upon each closure of said second switch.

* * * * *